(12) United States Patent
Nakamura

(10) Patent No.: US 11,331,764 B2
(45) Date of Patent: May 17, 2022

(54) POLISHING DEVICE, POLISHING METHOD, AND NON-TRANSITORY COMPUTER READABLE MEDIUM

(71) Applicant: EBARA CORPORATION, Tokyo (JP)

(72) Inventor: Akira Nakamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 234 days.

(21) Appl. No.: 16/447,769

(22) Filed: Jun. 20, 2019

(65) Prior Publication Data

US 2019/0389029 A1 Dec. 26, 2019

(30) Foreign Application Priority Data

Jun. 20, 2018 (JP) .............................. JP2018-116849

(51) Int. Cl.
*B24B 37/005* (2012.01)
*H01L 21/321* (2006.01)
*H01L 21/3105* (2006.01)
*B24B 37/04* (2012.01)

(52) U.S. Cl.
CPC .......... *B24B 37/005* (2013.01); *B24B 37/042* (2013.01); *H01L 21/31053* (2013.01); *H01L 21/3212* (2013.01)

(58) Field of Classification Search
CPC ..... B24B 37/005; B24B 37/04; B24B 37/042; B24B 37/30; B24B 49/16
See application file for complete search history.

(56) References Cited

U.S. PATENT DOCUMENTS

| 5,643,060 A * | 7/1997 | Sandhu ............... B23Q 15/013 451/285 |
| 2008/0146119 A1* | 6/2008 | Sasaki ..................... B24B 49/16 451/5 |
| 2012/0129431 A1 | 5/2012 | Hui et al. |
| 2013/0288571 A1* | 10/2013 | David ..................... B24B 49/12 451/5 |
| 2014/0065934 A1* | 3/2014 | Fukushima ............. B24B 37/30 451/364 |
| 2014/0087629 A1* | 3/2014 | Takahashi ............. B24B 37/005 451/5 |
| 2015/0255357 A1* | 9/2015 | Kobayashi .............. H01L 22/12 438/5 |

FOREIGN PATENT DOCUMENTS

JP 2015-168015 A 9/2015

* cited by examiner

*Primary Examiner* — Joel D Crandall

(74) *Attorney, Agent, or Firm* — BakerHostetler

(57) ABSTRACT

A polishing device includes a polishing table comprising a polishing surface, a top ring configured to press a polishing target surface against the polishing surface and comprising a plurality of pressing portions configured to independently apply a pressing force to a plurality of areas of the wafer, and a controller configured to store a first pressing portion effect rate for a first pressing portion of the plurality of pressing portions in a storage unit, the first pressing portion effect rate being a change in polishing amount of the polishing target surface for a change in pressing force applied by the first pressing portion and control the pressing force applied by the first pressing portion based on the first pressing portion effect rate and a polishing profile of the polishing target surface.

5 Claims, 11 Drawing Sheets

POLISHING DEVICE, POLISHING METHOD, AND NON-TRANSITORY COMPUTER READABLE MEDIUM

TECHNICAL FIELD

The present invention relates to a polishing device, a polishing method, and a non-transitory computer readable medium.

BACKGROUND ART

In recent years, as semiconductor devices are scaled down, making the device structure complex, there is a tendency that an increased number of irregularities are formed on a surface of a semiconductor device and steps become large. As a result, in forming a thin film, a film thickness is reduced at a step portion, wiring is disconnected to open a circuit, and a short circuit is caused by an insulation failure between wiring layers, resulting in a deteriorated yield. As a planarization method for solving these problems, for example, in a semiconductor device fabrication process on a semiconductor substrate, the chemical mechanical polishing (CMP) is adopted in which irregularities formed on a surface of a substrate during formation of an insulation film or a wiring metallic film are smoothed out through polishing.

In CMP, a substrate, which is a polishing target object, is pressed against a polishing pad formed of a nonwoven or the like, and the substrate and the polishing pad are caused to slide relative to each other for polishing while supplying abrasive grains between them. In polishing through CMP, it has been found out that forming concentric or lattice-like grooves on the surface of the pad is effective in supplying a sufficient amount of abrasive grains to a central portion of a substrate. In addition, in CMP, a so-called pad conditioning is applied to the polishing pad to remove polishing wastage adhering to the surface of the polishing pad by grinding part of the surface of the pad using a diamond disc or the like.

In general, in the field of polishing semiconductor substrates, it is widely known that a polishing amount Q can be estimated accurately to some extent from the formula of $Q \propto kpv\Delta t$ (where, Q denotes a polishing amount, k a coefficient determined based on polishing pad or polishing liquid, substrate material or the like, p a processing pressure, v a moving speed, and $\Delta t$ a processing time) which is known as Preston's Experimental Formula, and Preston's Experimental Formula is generally established also in CMP. Then, in the CMP process of polishing a wiring or an insulation film laminated on a substrate flat, polishing conditions used in a production line are optimized in advance, and such a wiring or insulation layer is polished until a polishing member is consumed to its consumption limit under the same conditions.

In the process of consumption of the polishing member, however, a surface profile of the wiring or the insulation film on the substrate after polishing (referred to as a polishing profile) varies with time according to the degree of consumption of the polishing member. This may produce variations in polishing amount over the wafer area by area and the polishing profile may vary. To deal with this, conventionally, a plurality of concentric air bags are provided on a top ring so as to independently apply pressing forces to a plurality of areas of a wafer, and a controller controls independently the pressing forces applied to the plurality of areas on the wafer by the plurality of air bags. This control is carried out in such a manner that, for example, in the case where the polishing amount is found insufficient in one of the plurality of areas in the polishing profile, the pressing force applied to the area in question by the air bag is increased.

CITATION LIST

Patent Literature

PTL 1: Japanese Patent Laid-Open No. 2015-168015

SUMMARY OF INVENTION

Technical Problem

As described above, in the conventional polishing device, in the case where the polishing amount is determined to be insufficient, for example, at a specific area, the pressing force of the pressing portion configured to press against the specific area in question is controlled to solve the insufficiency of the polishing amount. However, it has been found through the study carried out by the inventor and others that in the case where the pressing force applied to the specific area by the corresponding air bag (pressing portion) changes, not only does the polishing amount at the specific area change, but also the other areas that are pressed against by the other pressing portions are affected. Thus, it has been found out that there may occur from time to time a case where adopting the pressure control used by the conventional polishing device does not necessarily result in an optimal polishing profile.

The present invention has been made in view of the problem described above, and one of objects of the present invention is to provide a polishing device, a polishing method, and a polishing control program or a non-transitory computer readable medium that can equalize a polishing profile more.

Solution to Problem

According to an embodiment of the present invention, there is proposed a polishing device for polishing a polishing target surface of a wafer. The polishing device including a polishing table including a polishing surface, a top ring configured to press the polishing target surface against the polishing surface and including a plurality of pressing portions configured to independently apply a pressing force to a plurality of areas of the wafer, and a controller configured to store a first pressing portion effect rate for a first pressing portion of the plurality of pressing portions in a storage unit, the first pressing portion effect rate being a change in polishing amount of the polishing target surface for a change in pressing force applied by the first pressing portion and control the pressing force applied by the first pressing portion based on the first pressing portion effect rate and a polishing profile of the polishing target surface, wherein the first pressing portion effect rate is determined for an area wider than a first pressing area where the first pressing portion presses against the wafer. According to this polishing device, since the first pressing portion effect rate by the pressing force of the first pressing portion is determined for the area wider than the first pressing area where the first pressing portion presses against the wafer, the control on the pressing force applied by the first pressing portion can be executed more appropriately. This can equalize the polishing profile more.

According to another embodiment of the invention, there is proposed a polishing method for polishing a wafer by a top ring by pressing a polishing target surface of the wafer against a polishing surface, the top ring including a plurality of pressing portions configured to independently apply a pressing force to a plurality of areas of the wafer. The polishing method includes storing a first pressing portion effect rate for a first pressing portion of the plurality of pressing portions in a storage unit, the first pressing portion effect rate being a change in polishing amount of the polishing target surface for a change in pressing force applied by the first pressing portion, and controlling the pressing force applied by the first pressing portion based on the first pressing portion effect rate and a polishing profile of the polishing target surface, and the first pressing portion effect rate is determined for an area wider than a first pressing area where the first pressing portion presses against the wafer. According to this polishing method, a similar advantageous effect to that provided by the polishing device described above can be provided.

According to a further embodiment of the invention, there is proposed a non-transitory computer readable medium in which a polishing control program is stored, the polishing control program being for use in controlling a polishing device for polishing a wafer by a top ring by pressing a polishing target surface of the wafer against a polishing surface, the top ring comprising a plurality of pressing portions configured to independently apply a pressing force to a plurality of areas of the wafer. The polishing control program causes a computer to execute storing a first pressing portion effect rate for a first pressing portion of the plurality of pressing portions in a storage unit, the first pressing portion effect rate being a change in polishing amount of the polishing target surface for a change in pressing force applied by the first pressing portion, and controlling the pressing force applied by the first pressing portion based on the first pressing portion effect rate and a polishing profile of the polishing target surface, and the first pressing portion effect rate is determined for an area wider than a first pressing area where the first pressing portion presses against the wafer. According to this non-transitory computer readable medium, a similar advantageous effect to that provided by the polishing device described above can be provided.

DESCRIPTION OF EMBODIMENTS

Hereinafter, an embodiment of the present invention will be described by reference to drawings.

Figure 1:
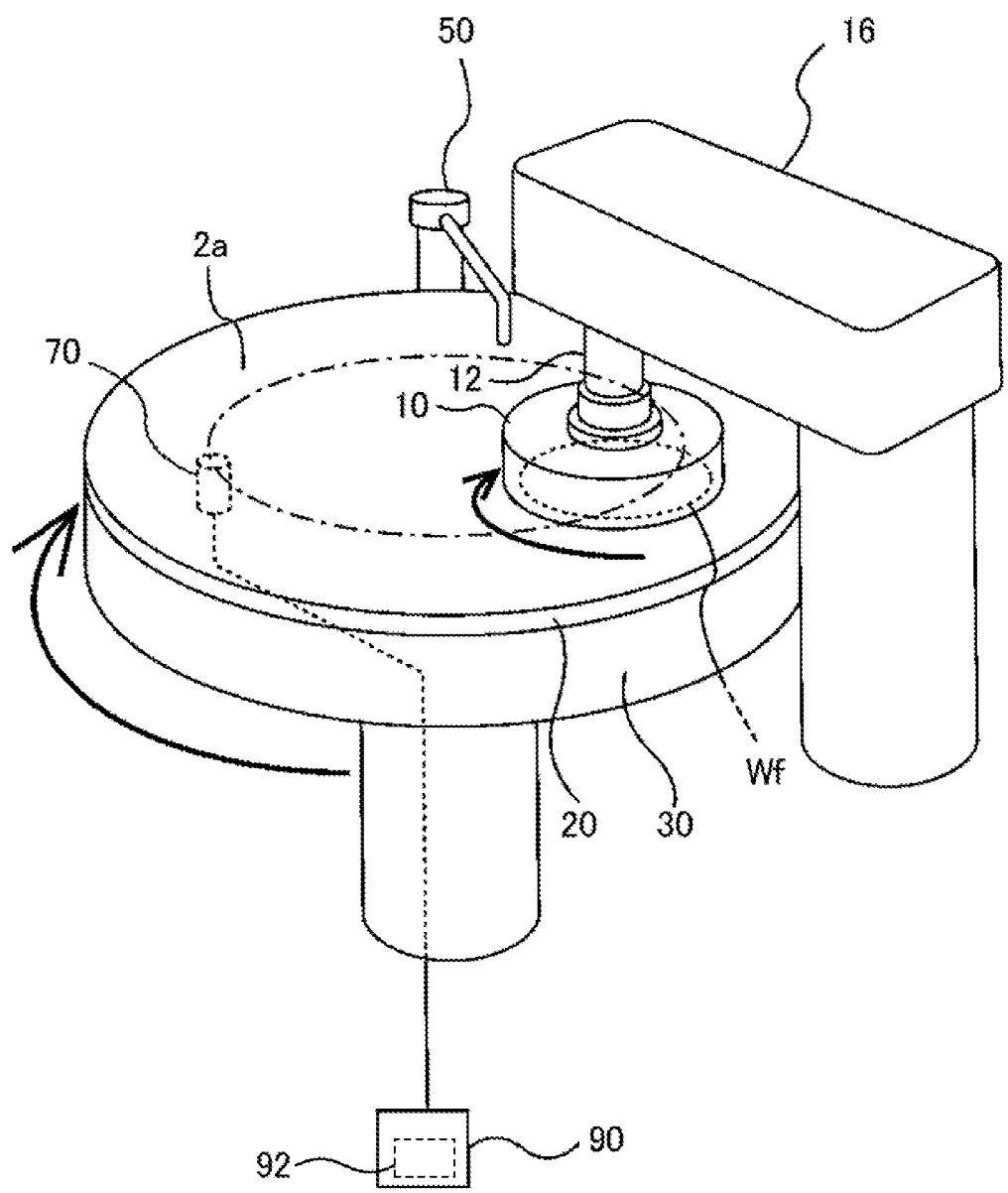
FIG. 1 is a schematic diagram illustrating a polishing device for polishing a wafer, which is an example of a substrate.

FIG. 1 is a schematic diagram illustrating a polishing device for polishing a wafer. As illustrated in FIG. 1, the polishing device includes a top ring 10 configured to hold and turn a wafer Wf, a polishing table 30 configured to support a polishing pad 20, a polishing liquid supply nozzle 50 configured to supply polishing liquid (slurry) to the polishing pad 20, and a film thickness sensor 70 configured to acquire a film thickness signal that varies according to a film thickness of a wafer Wf. An upper surface of the polishing pad 20 constitutes a polishing surface 20a configured to polish a wafer Wf.

The top ring 10 is coupled to a lower end of a top ring shaft 12. An upper end of the top ring shaft 12 is coupled to a turning device installed in a top ring arm 16. This turning device is configured to turn the top ring 10 in a direction indicated by an arrow via the top ring shaft 12. The top ring 10 is configured to hold a wafer Wf to a lower surface thereof through vacuum suction holding. The film thickness sensor 70 is installed in the polishing table 30 and turns together with the polishing table 30. The film thickness sensor 70 is configured to acquire film thickness signals on a plurality of areas including a center portion of a wafer Wf every time the polishing table 30 turns one whole turn. An optical sensor and an eddy current sensor are raised as an example of the film thickness sensor 70.

A wafer Wf is polished as below. The top ring 10 and the polishing table 30 turn in the same direction as indicated by arrows, and a polishing liquid is supplied from the polishing liquid supply nozzle 50 on to the polishing pad 20. In this state, the top ring 10 presses the wafer Wf against the polishing surface 20a of the polishing pad 20. A surface of the wafer Wf is polished by a mechanical action of abrasive grains contained in the polishing liquid and a chemical action of the polishing liquid. The polishing device of this type is known as a chemical mechanical polishing (CMP) device.

The film thickness sensor 70 turns together with the polishing table 30 while the wafer Wf is being polished and acquires a film thickness signal while moving across the surface of the wafer Wf. This thickness film signal is an index value indicating directly or indirectly the thickness of the wafer Wf and varies as the film thickness of the wafer Wf decreases. The film thickness sensor 70 is connected to a controller 90, and the film thickness signal is sent to the controller 90. The controller 90 stops polishing the wafer Wf when the thickness of the wafer Wf that is indicated by the film thickness signal reaches a target value.

Figure 2:
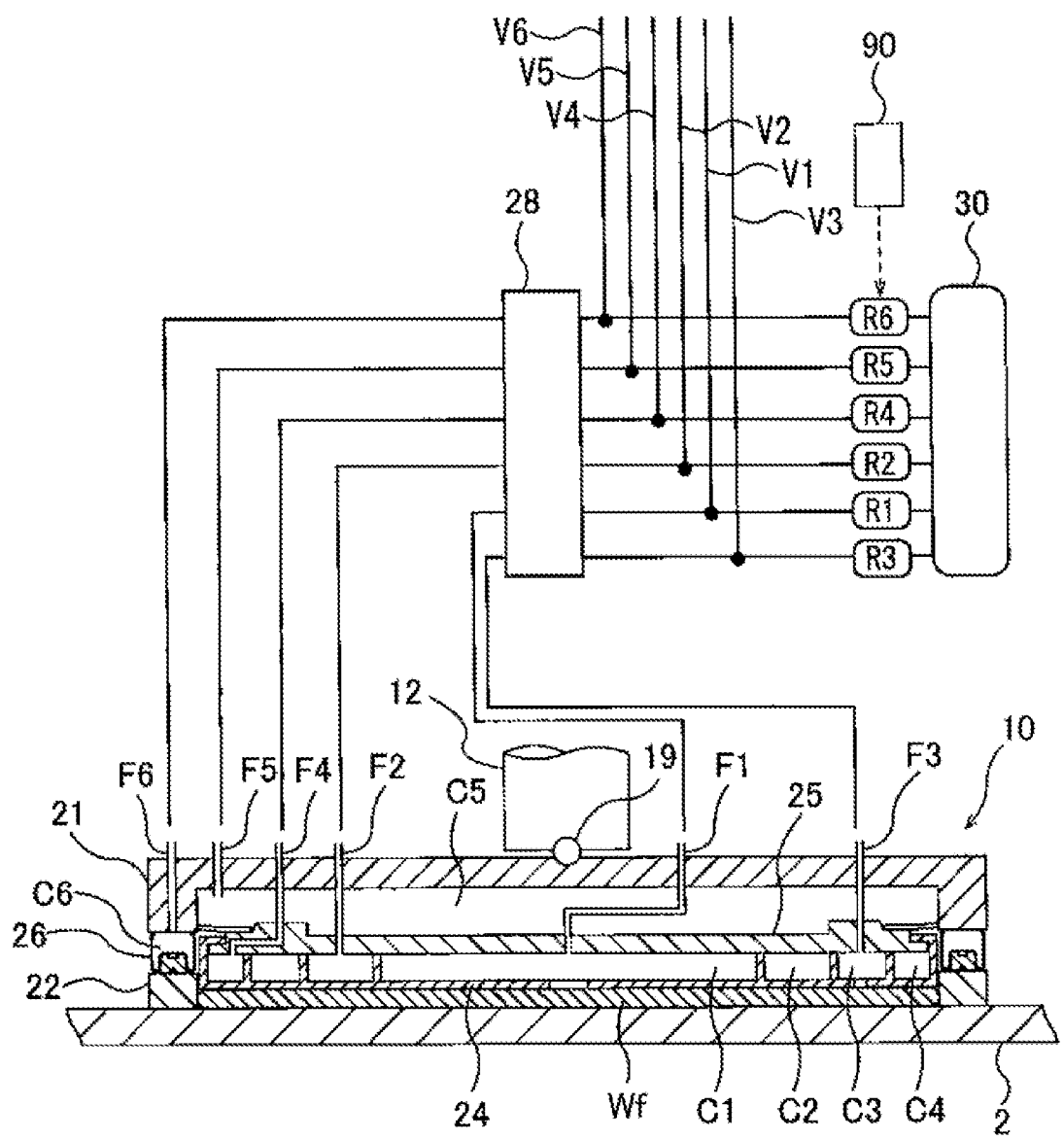
FIG. 2 is a cross-sectional view illustrating a top ring.

Next, the top ring 10 will be described. FIG. 2 is a cross-sectional view illustrating the top ring 10. The top ring 10 includes a top ring main body 21 that is coupled to the top ring shaft 12 via a universal joint 19 and a retainer ring 22 disposed directly below the top ring main body 21.

A soft membrane (elastic film) 24, which is brought into abutment with a rear surface (an opposite surface to the polishing target surface) of the wafer Wf, and a chucking plate 25, which holds the membrane 24, are disposed below the top ring main body 21. The membrane 24 and the chucking plate 25 constitute a "pressing portion" configured to apply a pressing force to the wafer Wf in this embodiment. Four pressure chambers C1, C2, C3, C4 are provided between the membrane 24 and the chucking plate 25. The pressure chambers C1, C2, C3, C4 are defined by the membrane 24 and the chucking plate 25. A central pressure chamber C1 is circular, and the other pressure chambers C2, C3, C4 are annular. These pressure chambers C1, C2, C3, C4 are arranged concentrically.

Pressurized gas such as pressurized air is supplied to the pressure chambers C1, C2, C3, C4 by the gas supply source 32 by way of gas transfer lines F1, F2, F3, F4. Vacuum lines V1, V2, V3, V4 are connected to the gas transfer lines F1, F2, F3, F4, respectively, so that negative pressures are formed in the pressure chambers C1, C2, C3, C4 by the vacuum lines V1, V2, V3, V4, respectively. Internal pressures in the pressure chambers C1, C2, C3, C4 can be changed independently of one another, whereby polishing pressures for the corresponding four areas, that is, a central portion, an inner middle portion, an outer middle portion, and a circumferential edge portion of the wafer Wf can be controlled independently.

A pressure chamber C5 is defined between the chucking plate 25 and the top ring main body 21, and pressurized gas is supplied to this pressure chamber C5 by the gas supply source 32 by way of a gas transfer line F5. A vacuum line V5 is connected to the gas transfer line F5, so that a negative pressure is formed in the pressure chamber C5 by the vacuum line V5. This enables the chucking plate 25 and the membrane 24 to move in an up-down direction as a whole.

A circumferential end portion of the wafer Wf is surrounded by the retainer ring 22, so that the wafer Wf is prevented from jumping out of the top ring 10 while the wafer Wf is being polished. An opening is formed in a portion of the membrane 24 where the pressure chamber C3 is defined, and the wafer Wf is sucked and held on to the top ring 10 by forming a vacuum in the pressure chamber C3. The wafer Wf is released from the top ring 10 by supplying nitrogen gas or clean air to the pressure chamber C3.

An annular rolling diaphragm 26 is disposed between the top ring main body 21 and the retainer ring 22, and a pressure chamber C6 is defined in an interior of the rolling diaphragm 26. The pressure chamber C6 is coupled to the gas supply source 32 by way of a gas transfer line F6. The gas supply source 32 supplies pressurized gas into the pressure chamber C6, whereby the retainer ring 22 is pressed against the polishing pad 20, A vacuum line V6 is connected to the gas transfer line F6, so that a vacuum is formed in the pressure chamber C6 by the vacuum line V6. The whole of the retainer ring 22 is raised when a negative pressure is formed in the pressure chamber V6.

Electropneumatic regulators (pressure regulators) R1, R2, R3, R4, R5, R6 are provided on the gas transfer lines F1, F2, F3, F4, F5, F6 that communicate with the pressure chambers C1, C2, C3, C4, C5, C6, respectively. Pressurized gas from the gas supply source 32 passes through the electropneumatic regulators R1 to R6 and is then supplied into the pressure chambers C1 to C6. The electropneumatic regulators R1 to R6 are connected to the pressure chambers C1 to C6 by the gas transfer lines F1 to F6, respectively. The gas transfer lines F1 to F6 extend as far as the electropneumatic regulators R1 to R6 by way of a rotary joint 28.

The electropneumatic regulators R1 to R6 controls pressures in the pressure chambers C1 to C6 by controlling a pressure of pressurized gas supplied from the gas supply source 32. The electropneumatic regulators R1 to R6 are connected to the controller 90. The pressure chambers C1 to C6 are also connected to an atmosphere opening valve (not shown), whereby the pressure chambers C1 to C6 can also be opened to the atmosphere. The controller 90 sends respective target pressure values of the pressure chambers C1 to C6 to the electropneumatic regulators R1 to R6, and the electropneumatic regulators R1 to R6 operate so that the pressures in the pressure chambers C1 to C6 are maintained at the corresponding target pressure values. The controller 90 controls the pressures in the pressure chambers C1 to C6 via the electropneumatic regulators (the pressure regulators) R1 to R6.

The pressures in the pressure chambers C1 to C6 are measured by a plurality of pressure sensors (not shown) that are incorporated in the electropneumatic regulators R1 to R6. Measured values of pressures in the pressure chambers C1 to C6 are sent to the controller 90. In the example illustrated in FIG. 2, although the four pressure chambers C1 to C4 are provided which are configured to press against the rear surface of the wafer Wf, less than four or more than four pressure chambers may be provided.

Figure 3:
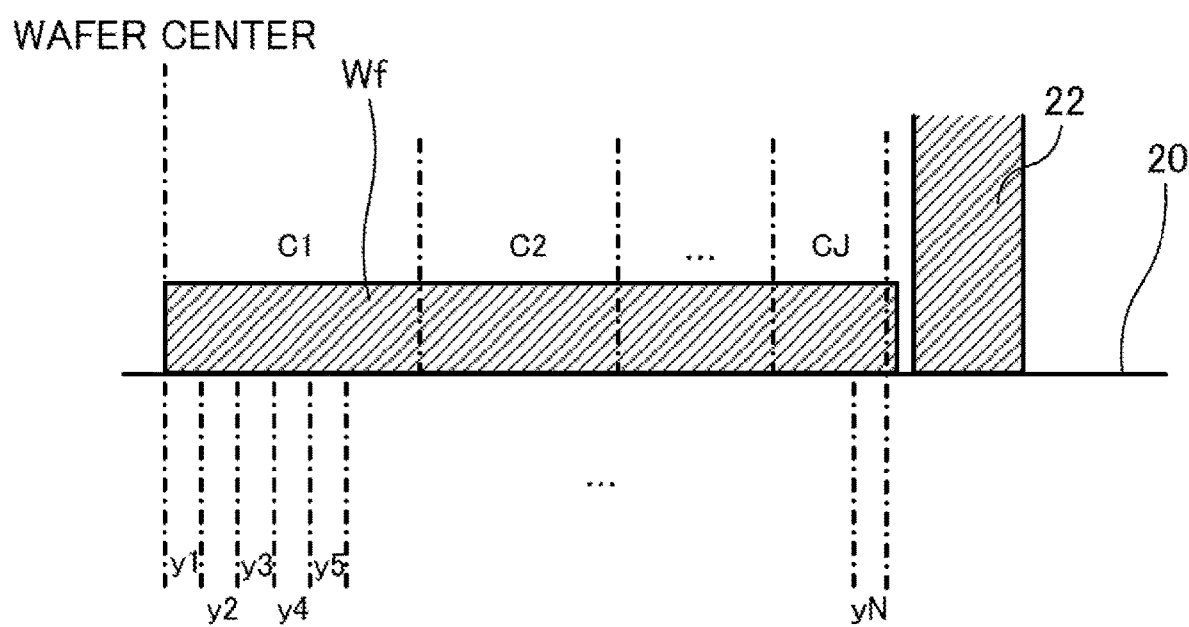
FIG. 3 is a schematic diagram illustrating an example in which a surface (a polishing target surface) of the wafer is divided into N areas.

FIG. 3 is a schematic diagram illustrating an example in which a surface (a polishing target surface) of the wafer Wf is divided into N areas (y1 to yN). The N areas are areas that are defined on the surface of the wafer Wf and are made up of one circular area positioned at the center of the wafer Wf and a plurality of annular areas that exist on an outer side of the centered circular area. In this embodiment, a width (a distance between an inside diameter and an outside diameter) of each of the plurality of annular areas is constant. In addition, J areas are defined on the rear surface of the wafer Wf in such a manner as to correspond to the pressure chambers C1 to CJ of the top ring 10. The J areas include the circular area positioned at the center of the wafer Wf and the plurality of annular areas existing on the outer side of the centered circular area. Uniform pressures are provided in the areas. In the following description, the J areas corresponding to the pressure chambers C1 to CJ are also called air bags C1 to CJ. In this embodiment, sizes of the air bags C1 to CJ are not constant, and the N areas on the polishing target surface do not correspond to the air bag C1 to CJ in a one-to-one fashion. However, the present invention is not limited to this example, and hence, the areas on the polishing target surface may be specified to correspond to the air bags C1 to CJ in the one-to-one fashion (N=J).

The description returns to FIG. 1. The controller controls the pressures in the pressure chambers C1 to CJ of the top ring 10 so that a polishing profile of the wafer Wf becomes a desired one to thereby control a pressing force applied to the wafer Wf by the plurality of membranes 24. The controller 90 is made up of a computer based on CPU. The controller 90 includes a storage unit 92 configured to store various types of programs and data. The storage unit 92 may be provided separately from the controller 90, so that the controller 90 gains access to the storage unit 92 through wireless or wired communication. In this embodiment, the controller 90 acquires a detection value from the film thickness sensor 70 during polishing and sets target pressures for the pressure chambers C1 to CJ based on the acquired detection value to thereby control the pressures in the pressure chamber C1 to CJ.

Figure 4:
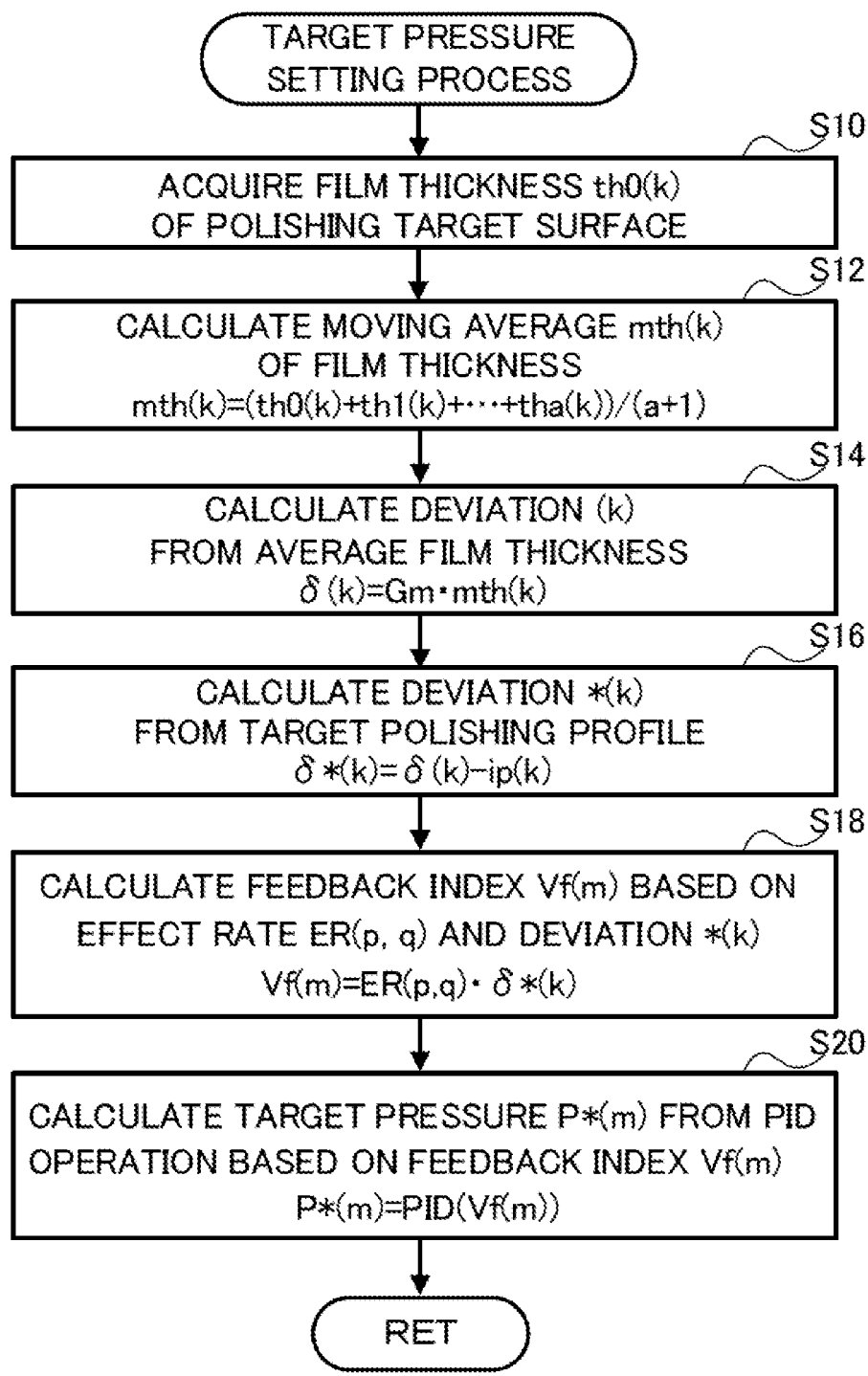
FIG. 4 is a flow chart illustrating an example of a target pressure setting process by a controller.

FIG. 4 is a flow chart illustrating an example of a target pressure setting process executed by the controller 90. This target pressure setting process is executed every predetermined period of time (for example, every several m sec) by the controller 90 during polishing.

Figure 5:
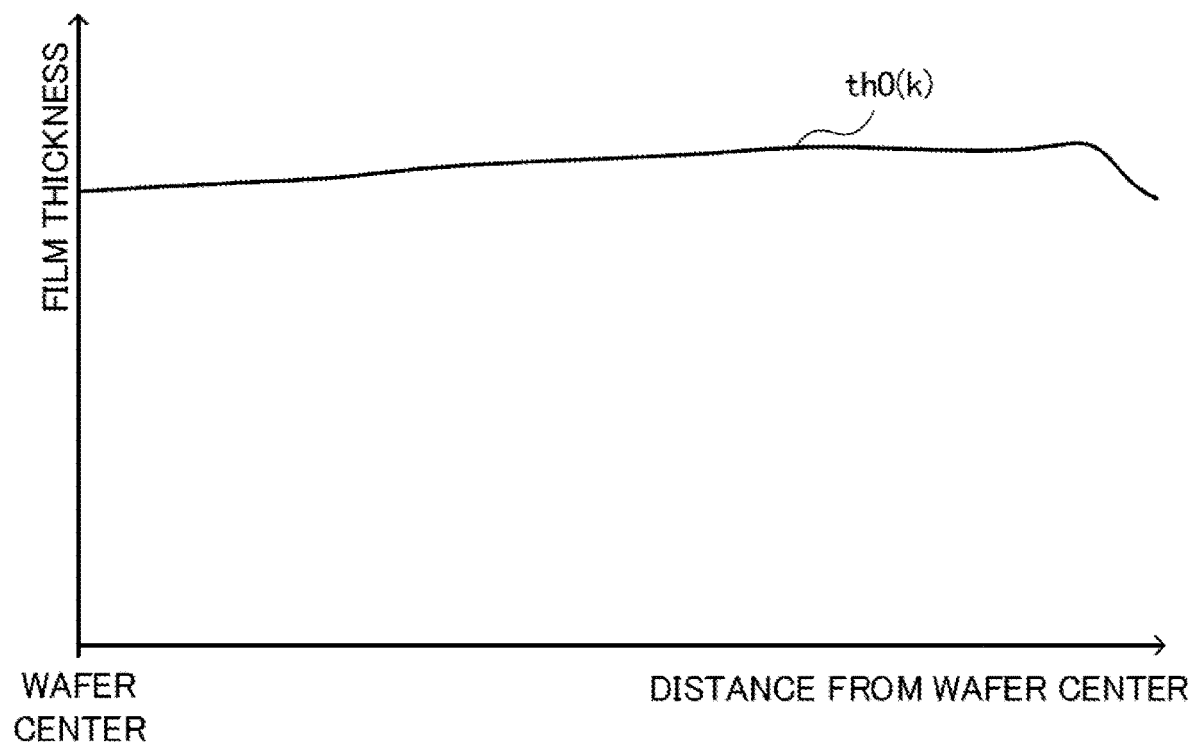
FIG. 5 is a chart illustrating an example in which a film thickness th0 ($k$) obtained from a film thickness sensor.

Upon execution of the target pressure setting process, the controller 90 firstly acquires a film thickness of the polishing target surface form the film thickness sensor 70 (S10). Here, the film thickness detected by the film thickness sensor 70 at each of the N areas on the polishing target surface is referred to as th0($k$). This th0($k$) is a column vector of a length N and corresponds to a polishing profile of the polishing target surface. FIG. 5 is a chart illustrating an example of a film thickness th0($k$) acquired from the film thickness sensor 70. In FIG. 5, an axis of ordinate denotes values (film thicknesses) of elements of the film thickness th0($k$), and an axis of abscissa denotes positions on the polishing target surface. In FIG. 5, the elements of the film thickness th0($k$) are illustrated as being connected together by a smooth curve. A target of the polishing device of this embodiment is that the film thickness th0($k$) acquired from the film thickness sensor 70 becomes a desired polishing profile when the polishing of the wafer Wf is finished. As an example, in this embodiment, the target of the polishing device is to flatten the polishing target surface of the wafer Wf, that is, to substantially equalize the constituent values of the th0 ($k$).

The controller 90 calculates a moving average of the th0($k$) acquired from the film thickness sensor 70 to reduce an effect, such as noise, at the time of measurement (S12). Specifically, letting a film thickness acquired currently be referred to as th0($k$), a film thickness acquired from the film thickness sensor 70 "a" times before be referred to as tha(k), and a film thickness by which the moving average is calculated be referred to as thm(k), the controller 90 needs to calculate a moving average of the film thickness using the following formula (1). The number of times that is determined in advance based on the accuracy of the film thickness sensor 70, the control cycle of the controller 90, and the like should be used for the number of times or "a" times over which a moving average is calculated.

$$thm(k) = (th0(k) + th1(k) + \ldots + tha(k))/(a+1) \quad (1)$$

Then, the controller 90 calculates a deviation δ(k) from an average film thickness for each of the N areas of the polishing target surface based on a film thickness moving average thm(k) (S14). As with the film thickness th0($k$), the deviation δ(k) is a column vector of a length N. In the process in S14, specifically, the controller 90 can calculate a deviation δ(k) from the average film thickness using the following formula (2).

[Formula 1]

$$\delta(k) = \begin{pmatrix} 1 - \frac{1}{N} & \cdots & -\frac{1}{N} \\ \vdots & \ddots & \vdots \\ -\frac{1}{N} & \cdots & 1 - \frac{1}{N} \end{pmatrix} \cdot thm(k) \quad (2)$$

Figure 6:
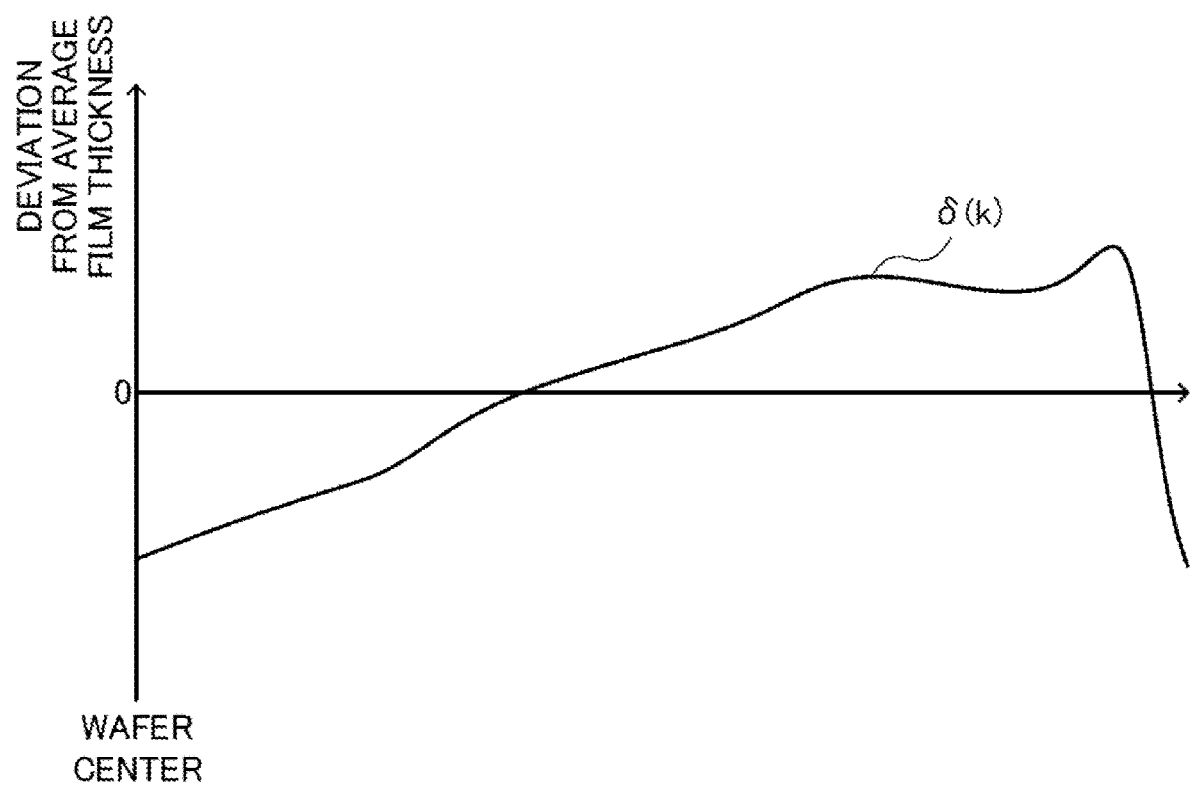
FIG. 6 is a chart illustrating an example a deviation δ ($k$)

FIG. 6 is a chart illustrating an example of a deviation δ(k). As in FIG. 5, in FIG. 6, an axis of ordinate denotes a value (deviation) of each of elements of δ(k), and an axis of abscissa denotes positions on the polishing target surface. In FIG. 6, the elements of the deviation δ(k) are connected together by a smooth curve. In the polishing device, the film thickness of the wafer Wf gradually decreases as the wafer Wf is polished. That is, even when a deviation from the target control is occurring due to, for example, a disturbance, or even when the current control is being executed in a preferred mode, a film thickness thm(k) acquired from the film thickness sensor 70 varies with time during polishing.

Consequently, in the case where the polishing target surface is attempted to match the desired polishing profile by using the film thickness thm(k) acquired from the film thickness sensor 70 without any change made thereto, a control is required in which a target polishing profile is determined with time or a polishing speed at the individual positions on the polishing target surface is controlled. In contrast to this, in the embodiment, since the deviation δ(k) from the average film thickness is calculated, the deviation δ(k) only has to be controlled to approach the target polishing profile, thereby making it possible to simplify the control.

Following this, the controller 90 calculates a deviation δ*(k) from the target polishing profile by reducing the target polishing profile ip(k) from the deviation δ(k) (S16). ip(k) is a column vector of a length N that is stored in advance in the storage unit 92 as the desired polishing profile at the end of polishing. In this embodiment, flattening the polishing target surface is an object to be attained, and values of elements of ip(k) are 0, and causing the elements of the deviation δ(k) to match 0 at the end of polishing. In this embodiment, in the example illustrated in FIG. 6, it is indicated that the polishing amount is slightly great in the area near the center of the wafer Wf, while the polishing amount is slightly small in part of the areas on the outer circumferential side of the wafer Wf.

Next, the controller 990 calculates a feedback index Vf(m) for each of the pressure chambers C1 to CJ based on the deviation δ*(k) and an effect rate ER(p, q) based on changes in pressure in the pressure chambers C1 to CJ using the following formula (2). Here, the effect rate ER(p, q) is a matrix of J×N, and elements in the p-th row denote rates of change in polishing amount in the areas on the polishing target surface that is divided into the N areas for a change in pressing force in a pressure chamber Cp. The feedback index Vf(m) is a column vector of a length J having an element corresponding to each of the pressure chambers C1 to CJ.

$$Vf(m) = ER(p,q)\delta^*(k) \quad (2)$$

Figure 7:
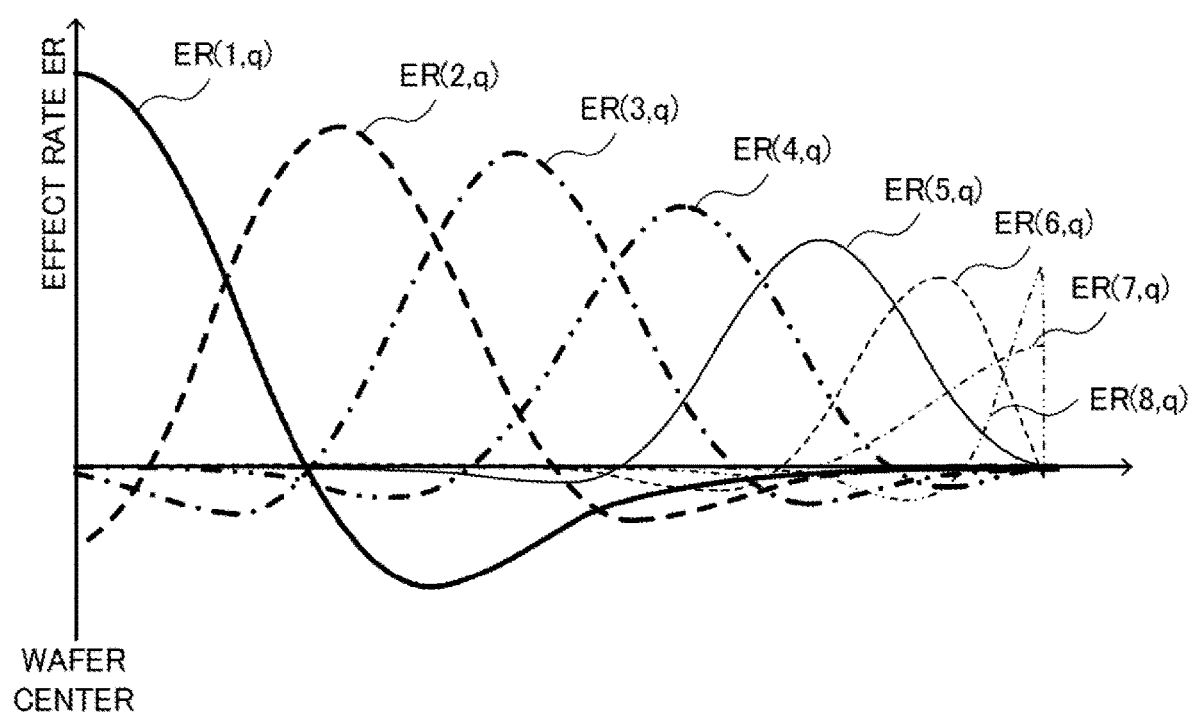
FIG. 7 is a chart illustrating an example of an effect rate ER.

FIG. 7 is a chart illustrating an example of an effect rate ER. In FIG. 7, an axis of ordinate denotes values of elements of an effect rate ER (p, q), and an axis of abscissa denotes positions on the polishing target surface. FIG. 7 illustrates the example of the effect rate ER when there are eight pressure chambers (J=8), and elements (ER(1, q) to ER(8, q)) corresponding to the pressure chambers C1 to C8 are individually indicated as being connected by smooth curves. The effect rate (p, q) should be determined in advance by polishing test wafers Wf and then be stored in the storage unit 92 of the controller 90. The effect rate(p, q) denotes an amount by which the polishing amount changes in each area on the polishing target surface when the pressure in each of the pressure chambers C1 to CJ is raised by a unit numerical value. As an example, referring to an effect rate ER(1, q) for the central pressure chamber C1 in FIG. 7, it is indicated that when the pressure in the pressure chamber C1 is raised, the polishing amount near the center of the wafer Wf that corresponds to the pressure chamber C1 is increased. On the other hand, it is indicated that when the pressure in the pressure chamber C1 is raised, the polishing amount is decreased in part of the area corresponding to other pressure chambers (in particular, the pressure chambers C2). In this way, according to the study carried out by the inventor and others, it has been found out that in the case where the pressure in a certain pressure chamber is raised (decreased), the polishing amount is increased (decreased) in the area corresponding to the pressure chamber in question, and the polishing amount is affected in the area corresponding to the other pressure chambers. Due to this, in the polishing device of the embodiment, for each of the pressure chambers C1 to CJ, the effect rate ER(p, q) is determined for the area wider than the pressing area (the first pressing area) where the pressure chamber (the first pressure chamber) Cq presses against the wafer Wf. Thus, the pressure in each of the pressure chambers C1 to CJ can be controlled more appropriately by calculating the feedback index Vf(m) for each of the pressure chambers C1 to CJ using the effect rate ER(p, q). Moreover, in this embodiment, the effect rate ER(p, q) is determined for more areas or segments (N areas or segments) than segments corresponding to the pressure chambers C1 to CJ (N>J). The N segments on the polishing target surface preferably divide the areas corresponding to the pressure chambers C1 to CJ into a plurality of segments. In this way, the polishing profile of the polishing target surface can be controlled more precisely within the areas corresponding to the pressure chambers C1 to CJ as a result of the effect rate ER being determined for the segments more than the segments corresponding to the pressure chambers C1 to CJ whereby the polishing profile can be equalized more.

Figure 8:
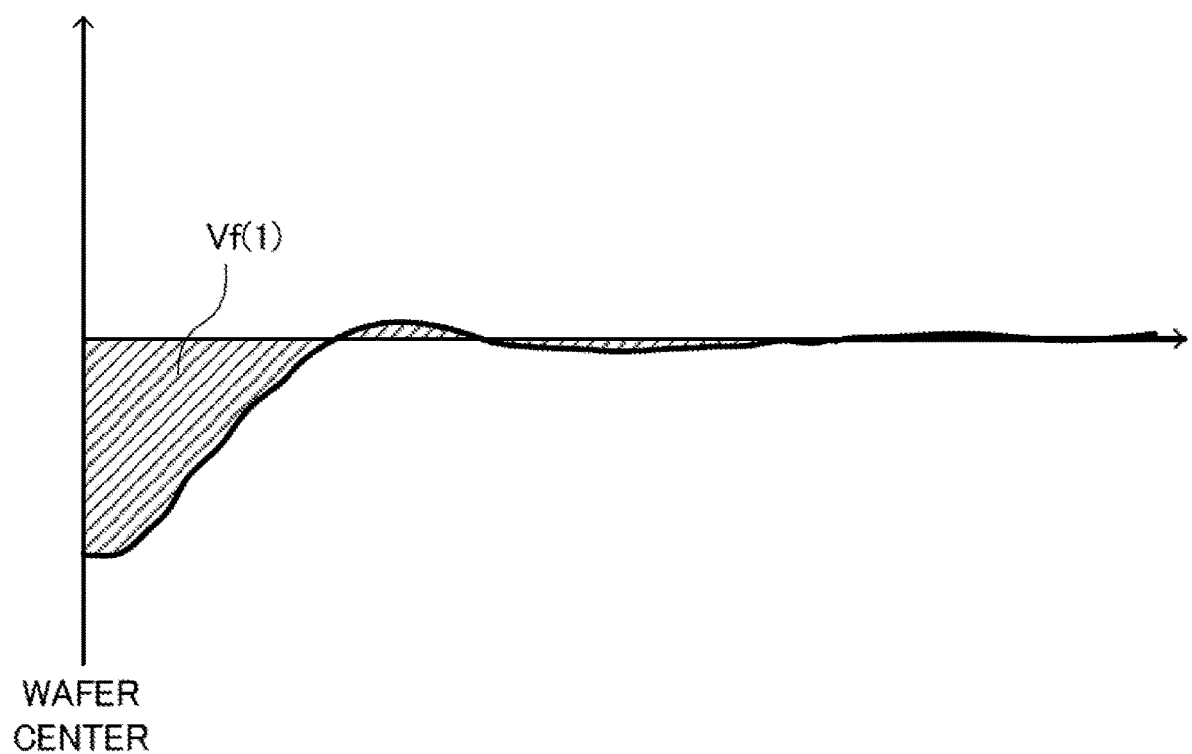
FIG. 8 is a chart illustrating an example of a result from multiplying elements of an effect rate (1, q) by elements of a deviation δ*($k$)

FIG. 8 is a chart illustrating an example of a result from multiplying the elements of the effect rate ER(p, q) by the elements of the deviation $\delta^*(k)$. A sum of the elements in FIG. 8 corresponds to a feedback index Vf(1) of the pressure chamber C1. In the example illustrated in FIG. 8, the feedback index of the pressure chamber C1 takes a minus value and acts as a factor decreasing the pressure exerted by the pressure chamber C1.

Then, the controller 90 calculates a target pressure P*(m) for each of the pressure chambers C1 to CJ through a PID operation based on the feedback index Vf(m) (S20) and ends the target pressure setting process. The target pressure P*(m) is a column vector of a length N in which the elements correspond to the target pressures of the pressure chambers C1 to CJ. The values that are determined in advance by polishing the test wafers Wf can be used for a proportional gain Gp, an integral gain Gi, and a differential gain Gd in the PID operation. Here, the proportional gain Gp, the integral gain Gi, and the differential gain Gd preferably use the values that are determined for each of the air bags C1 to CJ. The target pressure P*(m) for each of the pressure chambers C1 to CJ may be calculated through a PI operation, in place of the PID operation.

Figure 9:
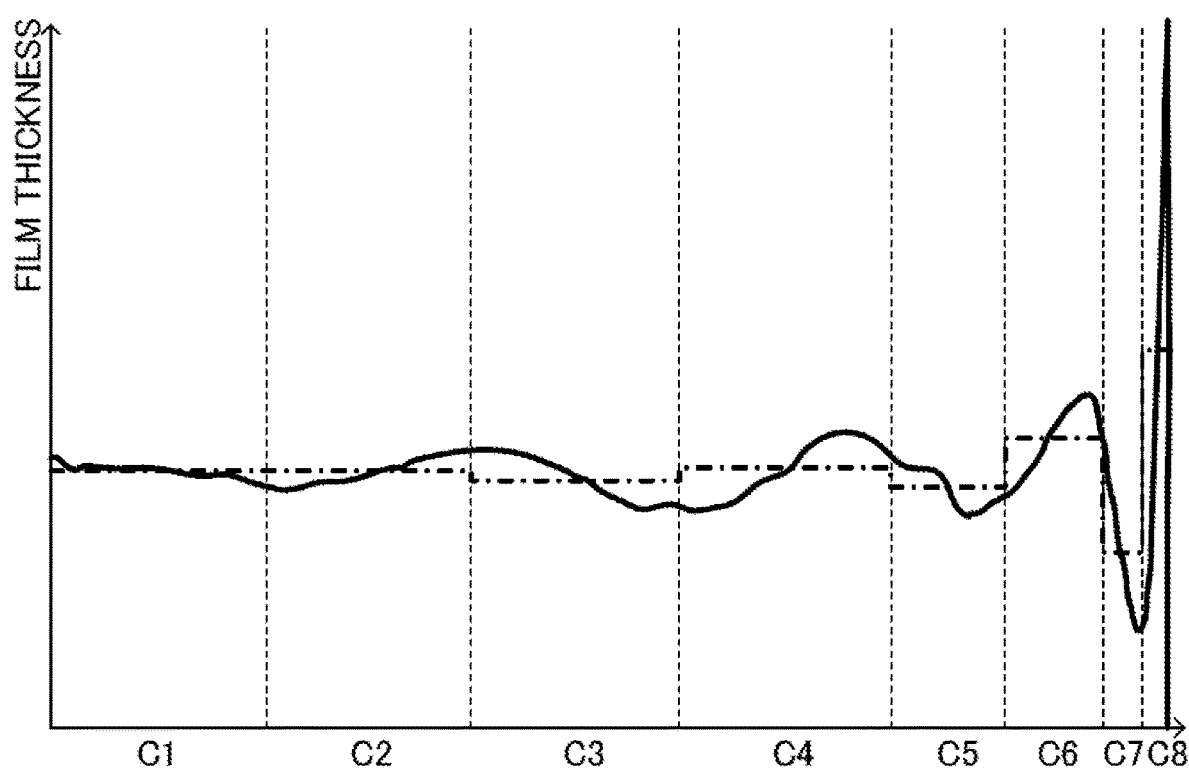
FIG. 9 is a chart illustrating an example of a polishing profile obtained by a conventional control.
Figure 10:
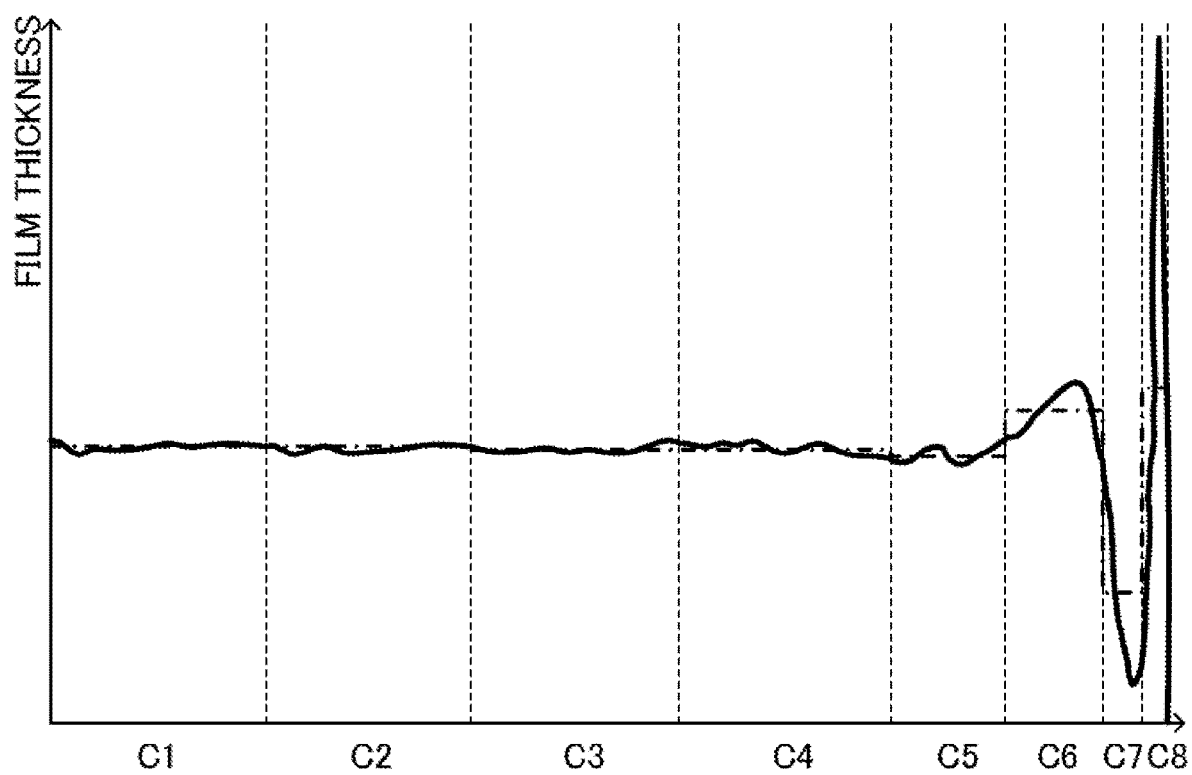
FIG. 10 is a chart illustrating an example of a polishing profile obtained by a control of an embodiment using the effect rate ER.

Hereinafter, an example will be described where the effectiveness of the control of the embodiment is verified by executing a polishing test. FIG. 9 is a chart illustrating an example of a polishing profile based on the conventional control, and FIG. 10 is a chart illustrating an example of a polishing profile based on the control of this embodiment using an effect rate ER. In the examples illustrated in FIGS. 9 and 10, there are eight air bags, and the control is executed so as to flatten the polishing target surface. In FIGS. 9 and 10, the polishing profile is indicated by a solid line, and average values of the air bags C1 to C8 are indicated by an alternate long and short dash line. As illustrated in FIG. 9, in the conventional control, a slight variation in average value is found in the air bags C1 to C8, and the polishing profile varies relative to the average values in the air bags C1 to C8. In contrast to this, as illustrated in FIG. 10, in the control of the embodiment, compared with the conventional control, the variation in average value is improved, and a variation in average value of the polishing profile is reduced in the air bags C1 to C8. In this way, an improvement in controllability can be realized by setting the target pressures for the air bags C1 to CJ by using the effect rate ER and through the PID operation.

In the embodiment that has been described heretofore, the predetermined proportional gain Gp, integral gain Gi and differential gain Gd are used as control parameters in the PID operation. These control parameters may be updated based on the result of a polishing performed on the polished wafer Wf in the controller 90. The controller 90 may update the control parameters, for example, every time a predetermined number of (for example, one or several) wafers Wf are polished or every time a predetermined period of time elapses. Additionally, the controller 90 may update the control parameters using the preceding polishing results (polishing data) while one wafer Wf is being polished. Here, as the results of polishing, a polishing profile, a variation response in polishing profile, a variation response in pressure in each of the air bags C1 to CJ are raised. As an example of an update based on the result of polishing, the control parameters can be updated by identifying a polishing model using the result of polishing and calculating control parameters based on a simulation for optimizing the polishing profile. The controller 90 may update the control parameters to predetermined values in place of calculating control parameters based on the result of polishing. That is, the controller 90 may change the control parameters from the first parameters to second parameters at a predetermined timing (for example, every time a predetermined number of wafers are polished or every time a predetermined period of time elapses).

In the embodiment described above, for example, the target pressure of the air bag C1 is calculated based on the feedback index Vf(1) of the air bag C1 through the PID operation. In addition to this, the controller 90 may correct the target pressure of the air bag C1 based on a feedback index Vf(p) of another air bag Cp, a target pressure of another air bag Cp obtained through a PID operation, or the like. For example, the controller 90 stores in advance an effect extent Ec of another air bag Cq resulting from a change in target pressure of a certain air bag Cp in the storage unit 92 by polishing test wafers Wf and corrects the target pressure P*(q) of the air bag Cq through "the change $\delta$P*(p) of the target pressure of the air bag Cp"×"the effect extent Ec", when a target pressure is set for the air bag Cq. By this control, when the target pressure of the other air bag Cp changes, the effect on the area corresponding to the air bag Cq can be reduced, that is, the interference of the plurality of air bags C1 to CJ with one another can be prevented.

(Handling of Information in Polishing Device)

An example of a configuration for handling information in the polishing device described above will be described by use of FIGS. 11 to 13. However, in FIGS. 11 to 13, the polishing device is briefly illustrated, and the specific configurations (the top ring 10, the polishing pad 20 and the like) are omitted from illustration.

Figure 11:
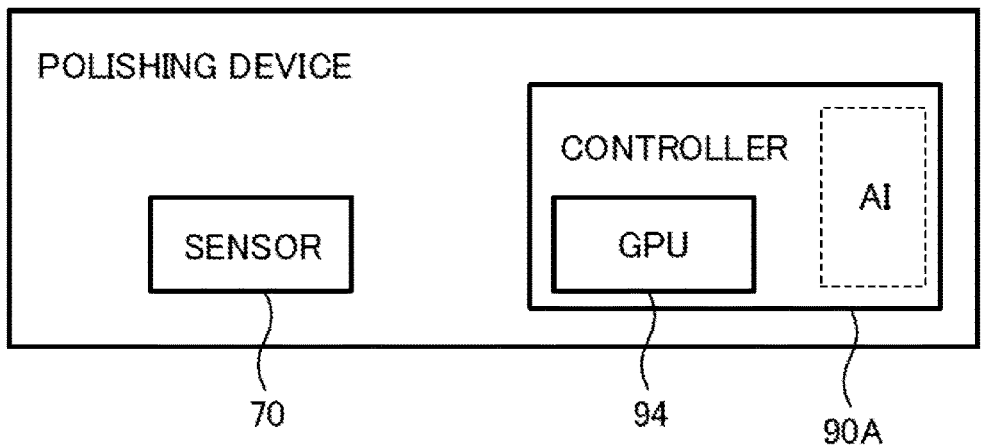
FIG. 11 is a diagram illustrating an example of a polishing device including a controller including a GPU.

FIG. 11 is a diagram illustrating an example of a polishing device including a controller 90A including a graphics processing unit (GPU) 94. An artificial intelligence (AI) function may be incorporated in the GPU 94. The GPU 94 may be some hardware and may be, for example, a program stored in a storage medium. In FIG. 11, although the GPU 94 is illustrated as an element independent of other elements of the controller 90A, the GPU 94 may be stored in a storage device (not shown) of the controller 90A to be controlled by a processor of the controller 90A. The GPU 94 is configured to execute a process requiring an image processing and a large-scale calculation such as generation and acquisition of a polishing profile, control parameter updating, and feedback of an actual main signal in the form of learning data.

The configuration illustrated in FIG. 11 has an advantage that the polishing device can operate alone (stand-alone).

Figure 12:
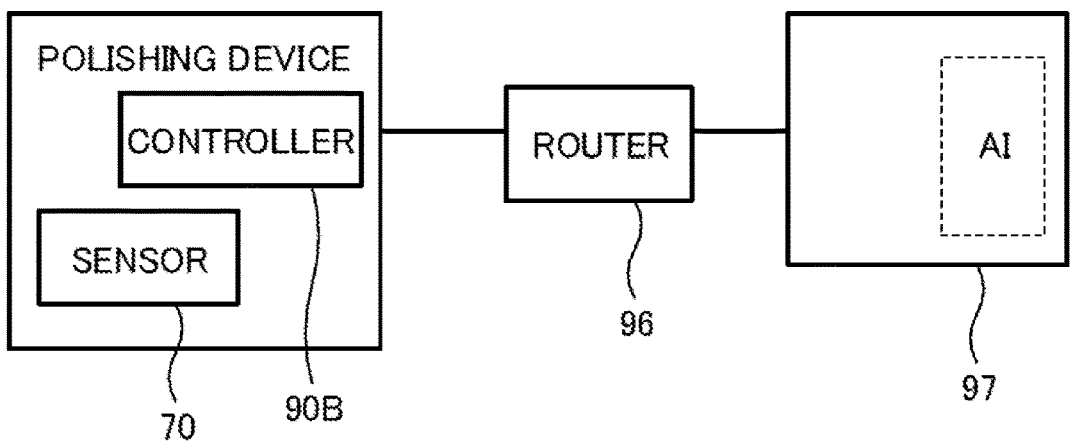
FIG. 12 is a diagram illustrating an example of a polishing device connected to a cloud via router.

FIG. 12 is a diagram illustrating an example of a polishing device that is connected to a cloud (or a fog) 97 via a router 96. The router 96 is a device for connecting a controller 90B with the cloud 97. The router 96 can also be called a "device having a gateway function". The cloud denotes a computer resource provided through a computer network such as the Internet or the like. In the case where the router 96 and the cloud 97 are connected via a local area network, the cloud may be the fog 97 from time to time. For example, in the case where multiple factories scattering worldwide are connected together, the cloud 97 needs to be used, while in the case where a network is established within a specific factory, the fog 97 needs to be used. The fog 97 may be connected with outside fogs or clouds. In FIG. 12, the controller 90B and the router 96 are connected together by a wire, and the router 96 and the cloud (or the fog) 97 are connected together by a wire. However, these connections may be executed wirelessly. Multiple polishing devices are connected to the cloud 97 (not shown). The multiple polishing devices are individually connected with the cloud 97 by way of corresponding routers 96. Data (film thickness data from the film thickness sensor 70 or other arbitrary pieces of information) obtained by each polishing device is accumulated in the cloud 97. Additionally, the cloud 97 in FIG. 12 may have an AI function, and data processing is executed in the cloud 97. However, the data processing may partially be executed in the controller 90B. The configuration illustrated in FIG. 12 has an advantage that the polishing devices can be controlled based on a large amount of accumulated data.

Figure 13:
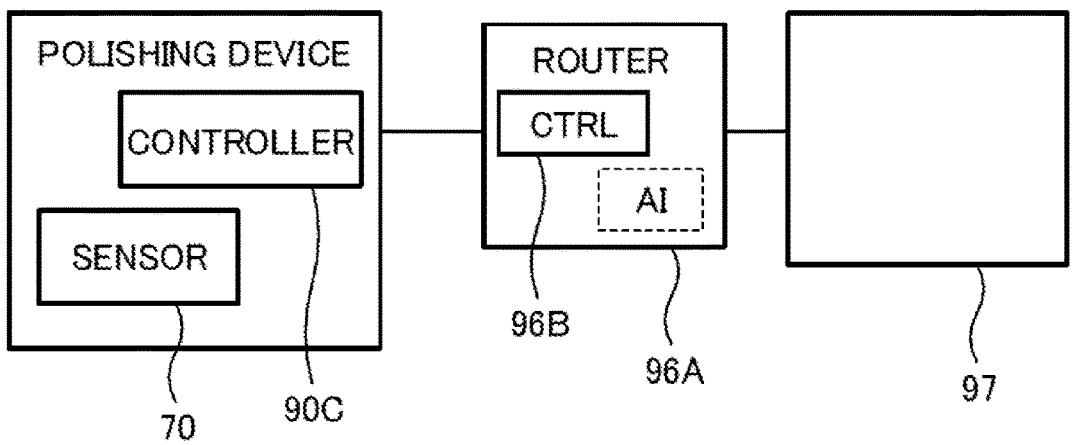
FIG. 13 is a diagram illustrating an example of a polishing device connected to a cloud via a router having an edge computing function.

FIG. 13 is a diagram illustrating an example of a polishing device connected to a cloud (or a fog) 97 by way of a router 96A having an edge computing function. The cloud 97 in FIG. 13 is also connected with multiple polishing devices (not shown). The multiple polishing devices in FIG. 13 are individually connected with the cloud 97 by way of corresponding routers 96A. However, some of the routers may not have the edge computing function (some of the routers may be the routers 96 illustrated in FIG. 12). The router 96A includes a controller 96B. However, in FIG. 13, the controller 96B is illustrated as being provided only in one router 96A as a representative of the routers 96A. Further, an AI function may be installed in the router 96A. The controller 96B and the AI function of the router 96A can process data obtained from a controller 90C of the polishing device near the polishing device. When referred to herein, closeness is not a term meaning a physical distance but is a term denoting a distance over the network. However, in many cases, being close in distance over the network coincides with being close in physical distance. Consequently, in the case where the operation speed in the router 96A is substantially the same as the operating speed in the cloud 97, the processing in the router 96A becomes faster than the processing in the cloud 97. Even in the event that the operation speed in the router 96A differs from the operation speed in the cloud 97, the speed at which information transmitted from a controller 90C arrives at the router 96A is faster than the speed at which information transmitted from the controller 90C arrives at the cloud 97.

The router 96A, or more specifically, the controller 96B of the router 96A processes only data requiring a high-speed processing in the data to be processed. The controller 96B of the router 96A transmits data unnecessary to be processed at high speeds to the cloud 97. The configuration illustrated in FIG. 13 has an advantage that the high-speed processing near the polishing device and the control based on the accumulated data are compatible with each other.

The present invention can also be described in the following modes.

[Mode 1] According to Mode 1, there is proposed a polishing device for polishing a polishing target surface of a wafer. The polishing device includes a polishing table including a polishing surface, a top ring configured to press the polishing target surface against the polishing surface and including a plurality of pressing portions configured to independently apply a pressing force to a plurality of areas of the wafer, and a controller configured to store a first pressing portion effect rate for a first pressing portion of the plurality of pressing portions in a storage unit, the first pressing portion effect rate being a change in polishing amount of the polishing target surface for a change in pressing force applied by the first pressing portion and control the pressing force applied by the first pressing portion based on the first pressing portion effect rate and a polishing profile of the polishing target surface, wherein the first pressing portion effect rate is determined for an area wider than a first pressing area where the first pressing portion presses against the wafer. According to this polishing device, since the first pressing portion effect rate by the pressing force of the first pressing portion is determined for the area wider than the first pressing area where the first pressing portion presses against the wafer, the control on the pressing force applied by the first pressing portion can be executed more appropriately. This can equalize the polishing profile more.

[Mode 2] According to Mode 2, in the polishing device of Mode 1, the polishing device includes a film thickness sensor configured to detect a film thickness of the polishing target surface, and the controller calculates a deviation for an average film thickness of the polishing target surface based on the detected film thickness and controls the pressing force applied by the first pressing portion based on the calculated deviation for the average film thickness and the first pressing portion effect rate. According to Mode 2, since the pressing force applied by the first pressing portion is controlled by calculating the deviation for the average film thickness, the control can easily be executed.

[Mode 3] According to Mode 3, in the polishing device of Mode 2, the controller calculates a variation in pressing force applied by the first pressing portion by integrating the calculated deviation for the average film thickness and the first pressing portion effect rate for each area on the polishing target surface.

[Mode 4] According to Mode 4, in the polishing device according to Modes 1 to 3, the controller calculates a control parameter for use in setting a pressing force to be applied by the first pressing portion through a simulation for optimizing a polishing profile for the polishing target surface based on a result of polishing of the polishing target surface. According to Mode 4, a good pressure control can be realized irrespective of a change in polishing properties due to deterioration of consumables or a change in polishing properties while one wafer is being polished. In addition, even in the case where the polishing properties stay relatively stable, the polishing properties can be grasped more accurately, thereby making it possible to realize an improvement in controllability.

[Mode 5] According to Mode 5, in the polishing device according to Modes 1 to 3, the controller changes a control parameter for use in setting a pressing force to be applied by the first pressing portion from a first parameter to a second parameter at a predetermined timing. According to Mode 5, a good pressure control can be realized according to a change in polishing properties due to deterioration of consumables or a change in polishing properties while one wafer is being polished.

[Mode 6] According to Mode 6, in the polishing device according to Modes 1 to 5, the controller calculates a pressing force to be applied by the first pressing portion using a PID operation expression so that a polishing target profile of the polishing target surface approaches a desired polishing target profile.

[Mode 7] According to Mode 7, in the polishing device according to Mode 6, the controller calculates a pressing force to be applied by a second pressing portion of the plurality of pressing portions using a PID operation expression and corrects the pressing force to be applied by the first pressing portion based on the calculated pressing force to be applied by the second pressing portion. According to Mode 7, the occurrence of interference can be prevented for a change in pressing force applied by the second pressing portion.

[Mode 8] According to Mode 8, in the polishing device according to Modes 1 to 7, the plurality of pressing portions include a plurality of concentric membranes.

[Mode 9] According to Mode 9, there is proposed a polishing method for polishing a wafer by a top ring by pressing a polishing target surface of the wafer against a polishing surface, the top ring including a plurality of pressing portions configured to independently apply a pressing force to a plurality of areas of the wafer. The polishing method includes storing a first pressing portion effect rate for a first pressing portion of the plurality of pressing portions in a storage unit, the first pressing portion effect rate being a change in polishing amount of the polishing target surface for a change in pressing force applied by the first pressing portion, and controlling the pressing force applied by the first pressing portion based on the first pressing portion effect rate and a polishing profile of the polishing target surface, and the first pressing portion effect rate is determined for an area wider than a first pressing area where the first pressing portion presses against the wafer. According to this polishing method, a similar advantageous effect to that provided by the polishing device described above can be provided.

[Mode 10] According to Mode 10, there is proposed a polishing control program for use in controlling a polishing device for polishing a wafer by a top ring by pressing a polishing target surface of the wafer against a polishing surface, the top ring comprising a plurality of pressing portions configured to independently apply a pressing force to a plurality of areas of the wafer. The polishing control program causes a computer to execute storing a first pressing portion effect rate for a first pressing portion of the plurality of pressing portions in a storage unit, the first pressing portion effect rate being a change in polishing amount of the polishing target surface for a change in pressing force applied by the first pressing portion, and controlling the pressing force applied by the first pressing portion based on the first pressing portion effect rate and a polishing profile of the polishing target surface, and the first pressing portion effect rate is determined for an area wider than a first pressing area where the first pressing portion presses against the wafer. According to this polishing control program, a similar advantageous effect to that provided by the polishing device described above can be provided.

Thus, while the embodiment of the present invention has been described heretofore, the above-described embodiment of the present invention is intended to facilitate the understanding of the present invention but is not intended to limit the present invention. The present invention can be modified or improved without departing from the gist and scope thereof, and equivalents thereof are, of course, included in the present invention. In addition, the embodiment and its modified examples can be combined in any way, provided that at least part of the problem described above can be solved, or provided that at least part of the advantageous effects can be provided, and claims, which will be made below, and the constituent elements described in the specification can be combined in any way or can be omitted.

REFERENCE SIGNS LIST

Wf: wafer
10: top ring
20: polishing pad
20a: polishing surface
23: polishing pad
24: membrane
25: chucking plate
30: polishing table
50: polishing liquid supply nozzle
70: film thickness sensor
90: controller
92: storage unit

What is claimed is:

1. A polishing device for polishing a polishing target surface of a wafer, comprising:
a polishing table comprising a polishing surface;
a top ring configured to press the polishing target surface against the polishing surface and comprising a plurality of pressing portions configured to independently apply a pressing force to a plurality of areas of the wafer;
a film thickness sensor configured to detect a film thickness of the polishing target surface; and
a controller configured to store a first pressing portion effect rate for a first pressing portion of the plurality of pressing portions in a storage unit, the first pressing portion effect rate being a change in polishing amount of the polishing target surface for a change in pressing force applied by the first pressing portion and control the pressing force applied by the first pressing portion based on the first pressing portion effect rate and a polishing profile of the polishing target surface,
wherein the first pressing portion effect rate is determined for an area wider than a first pressing area where the first pressing portion presses against the wafer,
wherein the controller calculates a deviation for an average film thickness of the polishing target surface based on the detected film thickness obtained during polishing of the wafer, and the controller calculates a feedback index of the first pressing portion by integrating the calculated deviation for the average film thickness and the first pressing portion effect rate for each area on the polishing target surface, and the controller calculates a pressing force to be applied by the first pressing portion using a PID operation expression based on the feedback index so that a polishing target profile of the polishing target surface approaches a desired polishing target profile.

2. The polishing device according to claim 1,
wherein the controller calculates a control parameter for use in setting a pressing force to be applied by the first pressing portion through a simulation for optimizing a polishing profile for the polishing target surface based on a result of polishing of the polishing target surface.

3. The polishing device according to claim 1,
wherein the controller changes a control parameter for use in setting a pressing force to be applied by the first pressing portion from a first parameter to a second parameter at a predetermined timing.

4. The polishing device according to claim 1,
wherein the controller calculates a pressing force to be applied by a second pressing portion of the plurality of pressing portions using a PID operation expression and corrects the pressing force to be applied by the first pressing portion based on the calculated pressing force to be applied by the second pressing portion.

5. The polishing device according to claim 1,
wherein the plurality of pressing portions comprise a plurality of concentric membranes.

* * * * *